(12) United States Patent  
Melanson (10) Patent No.: US 6,741,197 B1  
(45) Date of Patent: May 25, 2004

(54) DIGITAL-TO-ANALOG CONVERTER (DAC) OUTPUT STAGE

(75) Inventor: John Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/341,640

(22) Filed: Jan. 13, 2003

(51) Int. Cl.[7] ............................................. H03M 1/66
(52) U.S. Cl. ...................................... 341/150; 341/143
(58) Field of Search ................................ 341/143, 144, 341/150

(56) References Cited

U.S. PATENT DOCUMENTS

| | | | |
|---|---|---|---|
| 4,704,600 A | * 11/1987 | Uchimura et al. | ........... 341/143 |
| 5,068,661 A | 11/1991 | Kaneaki et al. | |
| 5,198,782 A | 3/1993 | Scott | |
| 5,245,344 A | 9/1993 | Sooch | |
| 5,724,038 A | * 3/1998 | Koifman et al. | ............. 341/144 |
| 5,821,892 A | 10/1998 | Smith | |
| 5,990,819 A | 11/1999 | Fujimori | |
| 6,483,449 B2 | * 11/2002 | Gandolfi et al. | ............. 341/143 |
| 2003/0169193 A1 | * 9/2003 | LeReverend et al. | ........ 341/143 |
| 2003/0179122 A1 | * 9/2003 | Yamamura | ................. 341/150 |

OTHER PUBLICATIONS

Senderowicz et al., PCM Telephony: Reduced Architecture for a D/A Converter and Filter Combination, IEEE J. of Solid–State Circuits, 25(4), 987–996, Aug. 1990.

Delta–Sigma Data Converters, Theory, Design and Simulation, Norsworthy et al., eds., IEEE Press, Piscataway, NJ, pp. 316–322, 332, 1997.

* cited by examiner

*Primary Examiner*—Howard L. Williams  
(74) *Attorney, Agent, or Firm*—Steven Lin, Esq.

(57) ABSTRACT

A digital-to-analog converter (DAC) output stage has an operational amplifier, an integrating path, a direct or data path, and a differentiated path. The integrating path is coupled in parallel to the operational amplifier. Each of the ends of the integrating path is respectively coupled to an input and an output of the operational amplifier. The direct or data path samples data during a first time sampling phase and is coupled in parallel with the integrating path during a second time sampling phase. The differentiated path is coupled in series with a data input voltage to the input of the operational amplifier.

22 Claims, 5 Drawing Sheets

DIGITAL-TO-ANALOG CONVERTER (DAC) OUTPUT STAGE

CROSS-REFERENCE TO RELATED APPLICATIONS

This Application cross-references U.S. patent application Ser. No. 10/256,499 entitled "Cascaded Noise Shaping Circuits with Low Out-of-Band Noise and Methods and Systems Using the Same," Inventor John L. Melanson, having a filing date of Sep. 27, 2002, which is hereby incorporated by reference in its entirety.

BACKGROUND OF THE INVENTION

1. Field of Invention

The present invention relates in general to digital-to-analog converter (DAC) systems, and, in particular, to digital-to-analog converter (DAC) output stages that accommodate multi-stage noise shaping (MASH) modulators or other such modulators with both data paths and differentiated paths.

2. Background of Invention

Delta-sigma modulators are particularly useful in digital-to-analog converter (DAC) systems. Using oversampling, a delta-sigma modulator spreads the quantization noise power across the oversampling frequency band, which is typically much greater than the input signal bandwidth. Additionally, the delta-sigma modulator performs noise shaping by acting as a highpass filter to the noise; most of the quantization noise power is thereby shifted out of the signal band. A delta-sigma DAC has a digital input summer, a digital interpolation filter, a digital feedback loop, a quantizer, and a DAC output stage at the modulator output. In a first order modulator, the interpolation filter comprises a single integrator stage; the filter in higher order modulators normally includes a cascade of a corresponding number of integrator stages. Higher-order modulators have improved quantization noise transfer characteristics over modulators of lower order, but stability becomes a more critical design factor as the order increases. For a given topology, the quantizer can be either a one-bit or a multiple-bit quantizer.

In cascaded delta-sigma modulator topologies, commonly referred to as MASH (multi-stage noise shaping) modulators, multiple delta-sigma noise shaping loops are cascaded to produce high noise attenuation in the signal band of the modulator noise transfer function (NTF) while maintaining modulator stability. In particular, the typical MASH modulator includes two or more cascaded noise shaping loops, each having a loop filter of a given number of filter stages and a quantizer. The quantized output of one noise shaping loop drives the input of the next noise shaping loop in the cascade such that, except for the first noise shaping loop, the input of each noise shaping loop is the quantization error from the previous noise shaping loop in the cascade. The output of each noise-shaping loop is also passed through error cancellation circuitry that cancels the quantization error from all but the last noise-shaping loop in the cascade. The noise shaping of the quantization error output from the last stage of the cascade is therefore approximately nth-order, where n is the total number of loop filter stages in the cascaded noise shaping loops.

Current state of the art conventional MASH modulator topologies are capable of providing signal band noise attenuation in the NTF on the order of −150 dB. Additionally, MASH modulators are less susceptible to DAC non-linearity in data converter applications and are generally more stable than single-loop modulators, especially when based on low-order, proven-stable individual noise shaping loops. However, conventional MASH modulator topologies also have significant drawbacks. For example, conventional MASH modulator topologies typically achieve high signal band noise attenuation at the expense of increased out-of-band noise gain. More recently, however, out-of-band noise has become a more troublesome problem that must be addressed, especially in such applications as high performance data converters. Consequently, substantial efforts typically must be made. For example, attenuating out-of-band modulator noise at the system level often requires more precise filtering and complicated clocking schemes, which add expense and complexity to the system.

Since the signal from a digital modulator may be low passed filter through switched capacitors (e.g., through a Butterworth filter), a charge transfer buffer is typically utilized at the DAC output stage. The charge transfer buffer receives the switched-capacitor filtered output from the digital modulator. The charge transfer buffer then converts the switched-capacitor filtered output into a continuous time format having relatively low distortion. However, such a charge transfer buffer does not have a differentiated path to accommodate a MASH modulator or other such modulator with both a data path and a differentiated path. A typical charge transfer buffer therefore can only receive signals from a data path, and a MASH modulator cannot utilize the advantages of such a charge transfer buffer.

Therefore, a new type of charge transfer buffer for the DAC output stage is needed to accommodate both the data path and the differentiated path so that a MASH modulator or other such modulator with both data and differentiated paths can utilize such a charge transfer buffer and have the advantages and benefits of such a charge transfer buffer.

SUMMARY OF INVENTION

The principles of the present invention are generally embodied in a digital-to-analog converter (DAC) output stage. A digital-to-analog converter (DAC) output stage has an operational amplifier, an integrating path, a direct or data path, and a differentiated path. The integrating path is coupled in parallel to the operational amplifier. Each of the ends of the integrating path is respectively coupled to an input and an output of the operational amplifier. The direct or data path samples data during a first time sampling phase and is coupled in parallel with the integrating path during a second time sampling phase. The differentiated path is coupled in series with a data input voltage to the input of the operational amplifier.

In one embodiment, the differentiated path is coupled to the input of the operational amplifier during the first time sampling phase. In this embodiment, the differentiated path further includes at least one differentiation capacitor and a second phase switch coupled in series to the at least one differentiation capacitor. The second phase switch is activated during the second sampling time phase and de-activated during the first sampling time phase. In another embodiment, the differentiated path has at least one differentiation capacitor. The DAC output stage further includes a second phase switch coupled between the input of the operational amplifier and one end of the direct path. The second phase switch is activated during the second sampling time phase and de-activated during the first sampling time phase.

The direct path further includes a direct capacitor. The direct path also has one switch coupled in one line with the direct capacitor. The one switch is activated during the first time sampling phase to switchingly couple the direct capacitor in parallel to the operational amplifier. The direct path further has another switch coupled in another line with the direct capacitor. This other switch is activated during the second time sampling phase to switchingly couple the direct capacitor between a ground reference voltage and a digital-to-analog converter element.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment(s) depicted in FIGS. 1 to 5 of the drawings, in which like numbers designate like parts.

Figure 1:
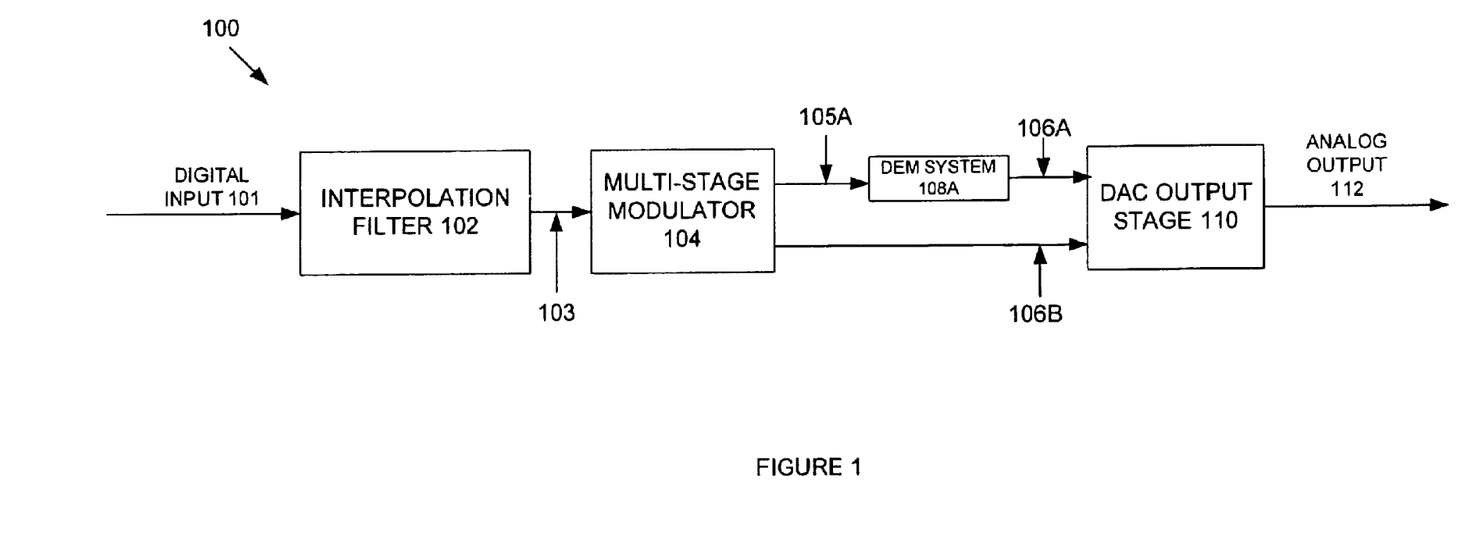
FIG. 1 is a block diagram of an exemplary digital-to-analog converter (DAC) system that incorporates a DAC output stage in accordance with the present invention.
Figure 2:
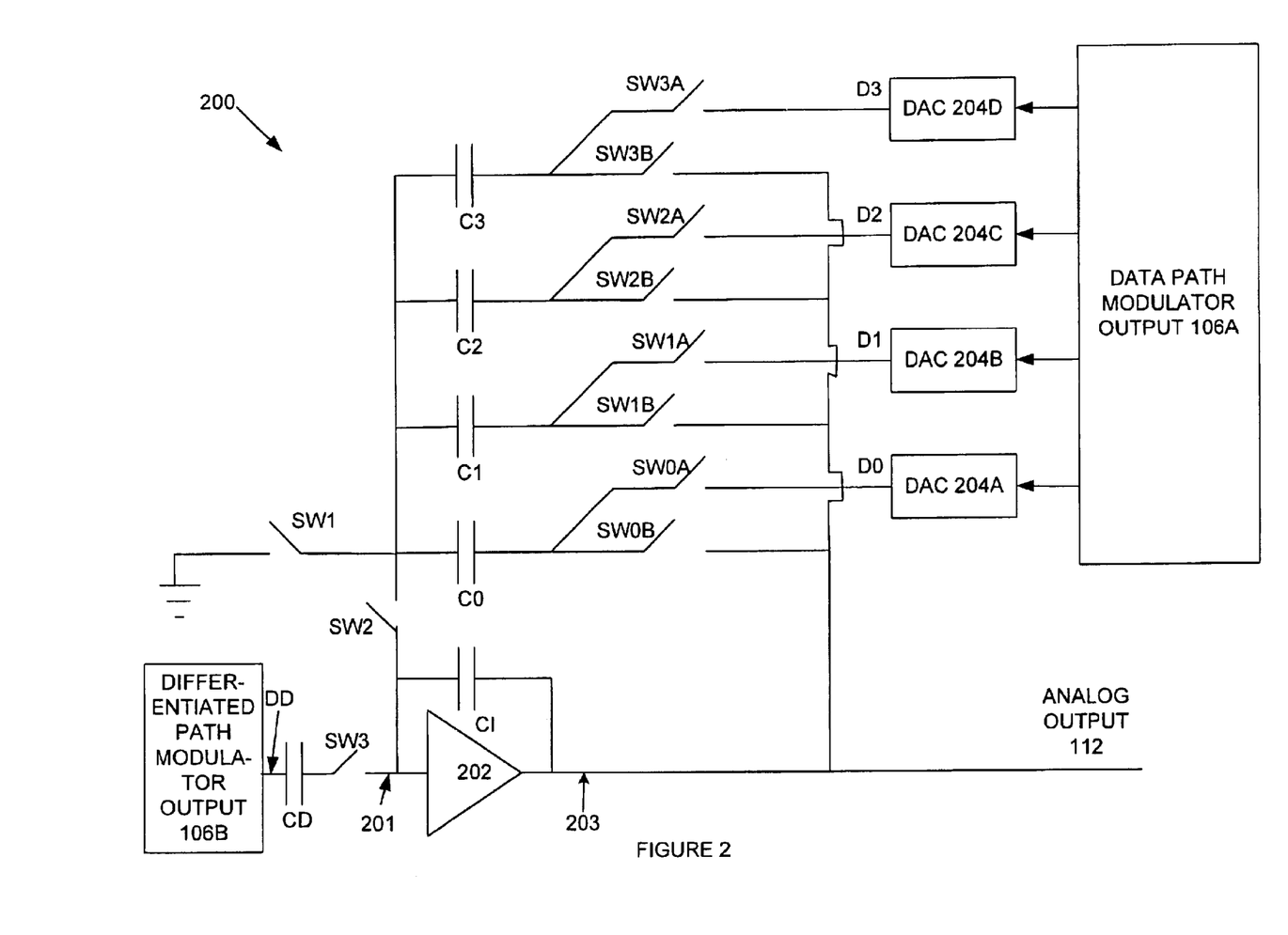
FIG. 2 is a circuit diagram of one exemplary embodiment of the digital-to-analog (DAC) output stage in accordance with the present invention that may be implemented in the DAC system of FIG. 1.
Figure 3:
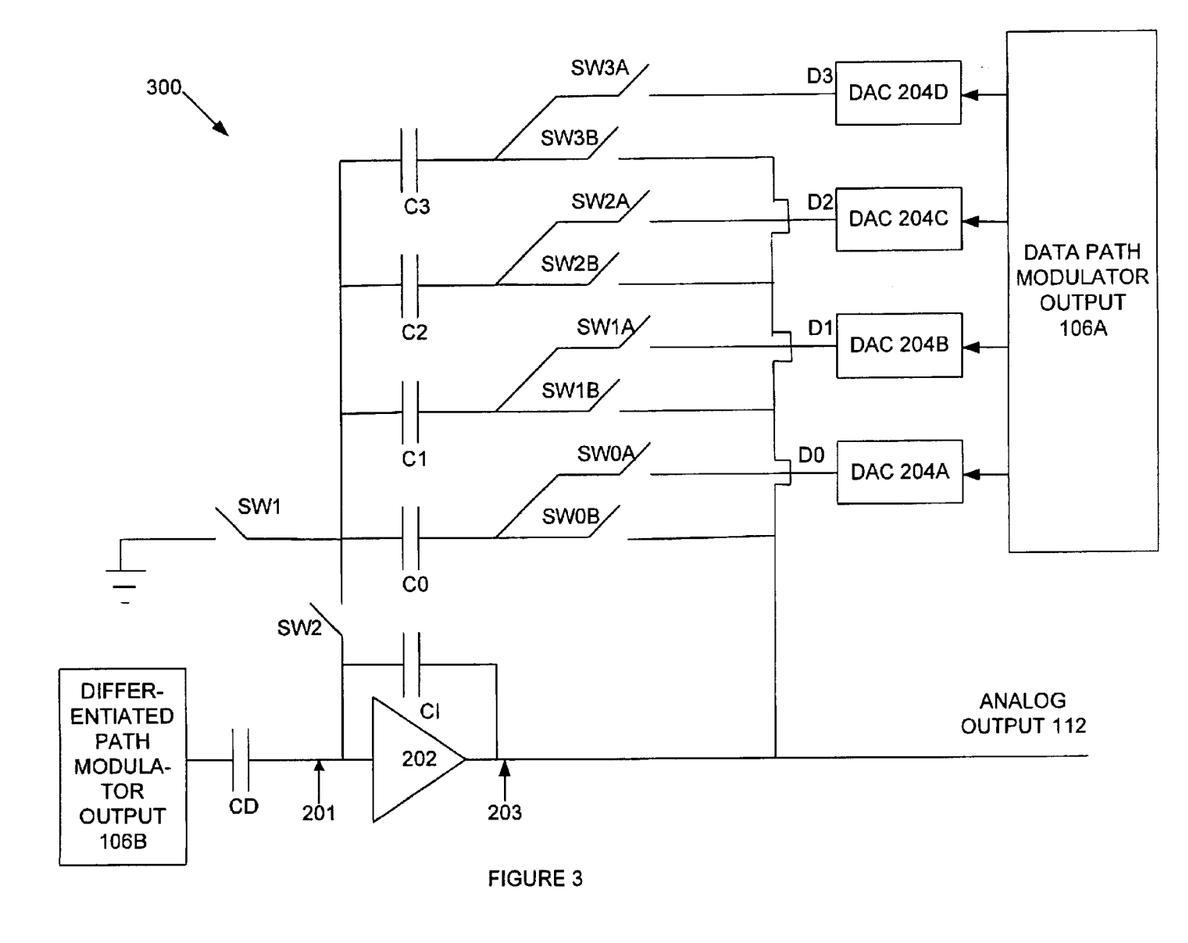
FIG. 3 is another circuit diagram of another exemplary embodiment of the digital-to-analog (DAC) output stage in accordance with the present invention that may be implemented in the DAC system of FIG. 1.

With reference now to FIG. 1, a block diagram of an exemplary digital-to-analog converter (DAC) system 100, which incorporates either a digital-to-analog converter (DAC) output stage 200 of FIG. 2 or a DAC output stage 300 of FIG. 3 in accordance with the present invention, is shown. DAC system 100 includes an interpolation filter 102, a multi-stage modulator 104, a dynamic element matching (DEM) system 108A, and a DAC output stage 110 (e.g., analog output stage) coupled together in series as shown in FIG. 1. DAC output stage 110 may either be a DAC output stage 200 of FIG. 2 or DAC output stage 300 of FIG. 3.

Interpolation filter 102 receives a digital input 101. Digital input 101 is a first digital signal at a first frequency. Interpolation filter 102 interpolates digital input 101 to a second digital signal 103 at a second frequency greater than the first frequency. Multi-stage modulator 104 may be a multi-stage noise shaping (MASH) modulator. A MASH modulator has various delta-sigma noise shaping loops cascaded together that noise shapes the second digital signal to produce a third set of digital signals 105A and 106B with a high noise attenuation in a signal band of a noise transfer function of the MASH modulator. Digital signal 105A is a data or direct path modulator output signal while digital signal 106B is a differentiated path modulator output signal. Digital signal 105A is fed into a dynamic element matching (DEM) system 108A.

DAC output stage 110 has digital-to-analog converter (DAC) elements (e.g., DAC elements 204A to 204D in FIGS. 2, 3, and 5, and also DAC elements 204A' to 204D' in FIG. 5), that each converts one digital bit into a weighted-step analog voltage or current. Currents or voltages generated by the weighted conversion elements for the digital word being converted are then summed to generate the analog output signal. However, mismatch between DAC elements causes the weighted-steps of current or voltage to deviate from their ideal weighted-step values. The deviations may be a result of differences that exist among the conversion elements from the manufacturing or fabrication processes. Element mismatches are the result of mismatch noise and distortion in the output signal. Consequently, a DEM system 108A is included at the input of DAC output stage 110 (e.g., before the DAC elements), and the DEM system spreads the mismatch noise across the analog output signal band. Data or direct path output 106A from DEM system 108A and differentiated path output 106B are fed into DAC output stage 110. DAC output stage 110 receives data path output 106A and differentiated path output 106B and converts these signals into an analog output 112.

Referring now to FIG. 2, DAC output stage 200 is one exemplary embodiment of a DAC output stage in accordance with the present invention. DAC output stage 200 has an operational amplifier 202 having an input 201 and an output 203. An integrating path is coupled in parallel to operational amplifier 202. Each of the ends of the integrating path is respectively coupled to input 201 and output 203. The integrating path is basically an integrating capacitor CI as shown in FIG. 2. DAC output stage 200 further has a data or direct path, which samples data (e.g., data bits D0, D1, D2, D3) during a first time sampling phase and is coupled in parallel with the integrating path, which samples integrated data (e.g., data bit DD), during a second time sampling phase.

The data or direct path in FIG. 2 includes direct capacitors C0, C1, C2, and C3 coupled in line with respective switches SW0A, SW1A, SW2A, and SW3A and further coupled in another line with respective switches SW0B, SW1B, SW2B, and SW3B. During a first time sampling phase $\phi_1$, switches SW0A, SW1A, SW2A, and SW3A and a first phase switch SW1 are activated to switchingly couple respective direct capacitors C0, C1, C2, and C3 between a ground reference and corresponding DAC elements 204A, 204B, 204C, and 204D in accordance with the control of DEM system 108A. After a very slight delay, switches SW0B, SW1B, SW2B, and SW3B and second phase switch SW2 are de-activated during the first time sampling phase $\phi_1$. During the first time sampling phase $\phi_1$, direct capacitors C0, C1, C2, and C3 correspondingly charge up for sampling the data (e.g., data bits D0, D1, D2, D3) based on data path modulator output 106A.

During a second time sampling phase $\phi_2$, switches SW0B, SW1B, SW2B, and SW3B and second phase switch SW2 are activated to switchingly couple respective direct capacitors C0, C1, C2, and C3 in parallel with integrating capacitor CI and operational amplifier 202 as shown in FIG. 2. After a very slight delay, switches SW0A, SW1A, SW2A, and SW3A and first phase switch SW1 are de-activated during the second time sampling phase $\phi_2$. During the second time sampling phase $\phi_2$, a differentiated path of DAC output stage 200 is coupled to the input of operational amplifier 202. The differentiated path has one or more differentiation capacitors CD and another second phase switch SW3, which are coupled together in series as shown in FIG. 2. Second phase switches SW2 and SW3 are activated to couple differentiation capacitor CD to the input of operational amplifier 202, which receives differentiated path modulator output 106B (e.g., sample data bit DD), during the second time sampling phase. Differentiation capacitor CD charges up according to differentiated path modulator output 106B. Operational amplifier 202 then operates as a buffer to transfer and convert the charges among capacitors CD, CI, C0, C1, C2, and C3 into an analog output 112.

The mathematical equation for analog output 112 (e.g., indicated as "Output" below) is as follows:

$$Output = \frac{1}{1 - \frac{CI}{CI+C0+C1+C2+C3}*Z^{-1}} * \frac{C0*D0+C1*D1+C2*D2+C3*D3+CD*(1-Z^{-1})*DD}{CI+C0+C1+C2+C3}$$

The differentiation capacitor CD adds the transfer function of $(1-Z^{-1})$. The "$CD*(1-Z^{-1})$" term in the above equation represents the differentiated path of DAC output stage 200. The remaining parts of the equation represent the data or direct path of DAC output stage 200. Therefore, DAC output stage 200 is able to accommodate a multi-stage modulator (such as a MASH modulator) since it provides for processing a direct or data path signal as well as a differentiated path signal.

With reference now to FIG. 3, DAC output stage 300 is another exemplary embodiment of a DAC output stage in accordance with the present invention. DAC output stage 300 is identical in design and operation to DAC output stage 200 except that instead additional second phase switch SW3 in DAC output stage 200 that is coupled in line with differentiation capacitor CD is eliminated in DAC output stage 300 as shown in FIG. 3. In this embodiment, differentiation capacitor CD is always coupled (whether in the first time sampling phase $\phi_1$ or second time sampling phase $\phi_2$) between differentiated path modulator output 106B and the input of operational amplifier 202. During second time sampling phase $\phi_2$, switches SW0B, SW1B, SW2B, and SW3B and second phase switch SW2 are activated to switchingly couple respective direct capacitors C0, C1, C2, and C3 in parallel with integrating capacitor CI and operational amplifier 202 as shown in FIG. 3. After a very slight delay, switches SW0A, SW1A, SW2A, and SW3A and first phase switch SW1 are de-activated during the second time sampling phase $\phi_2$. DAC output stage 300 has the same "Output" as DAC output stage 200 in accordance with the same mathematical equation above.

Figure 4:
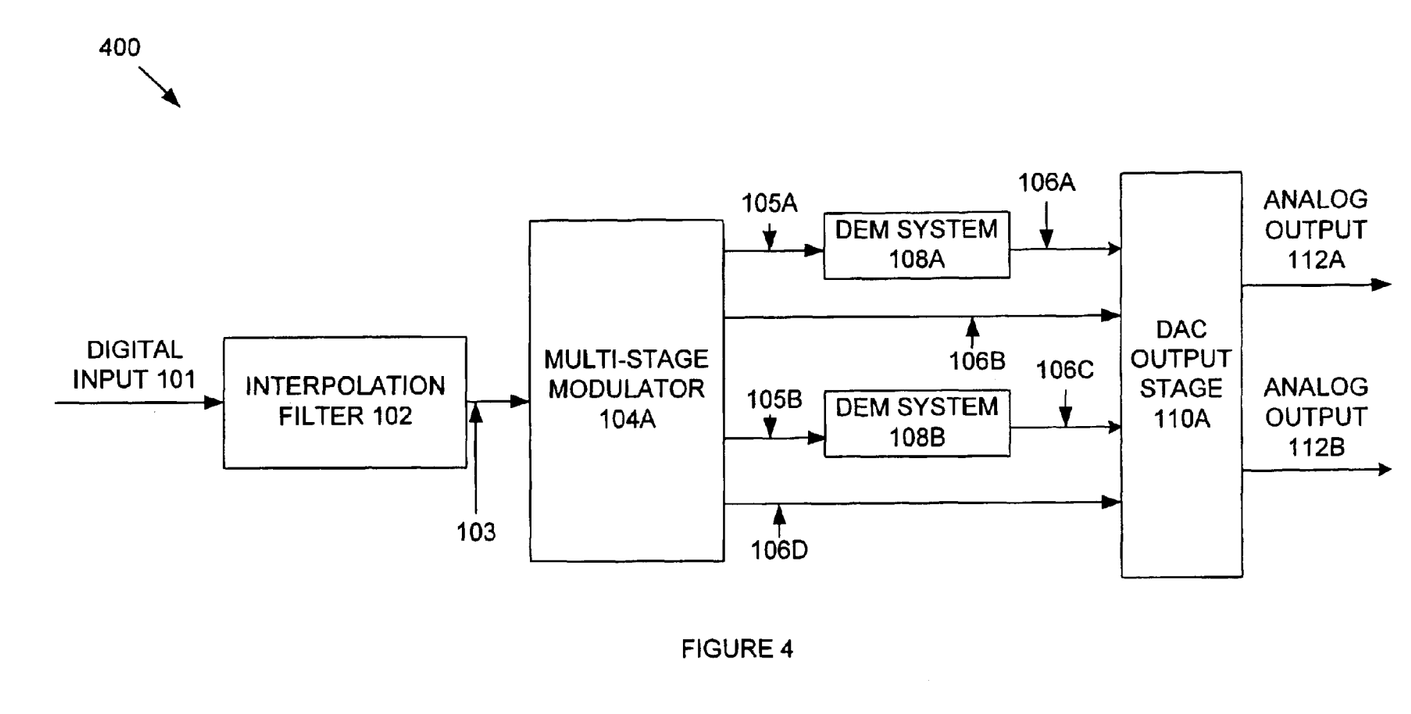
FIG. 4 is a block diagram of another exemplary digital-to-analog converter (DAC) system.
Figure 5:
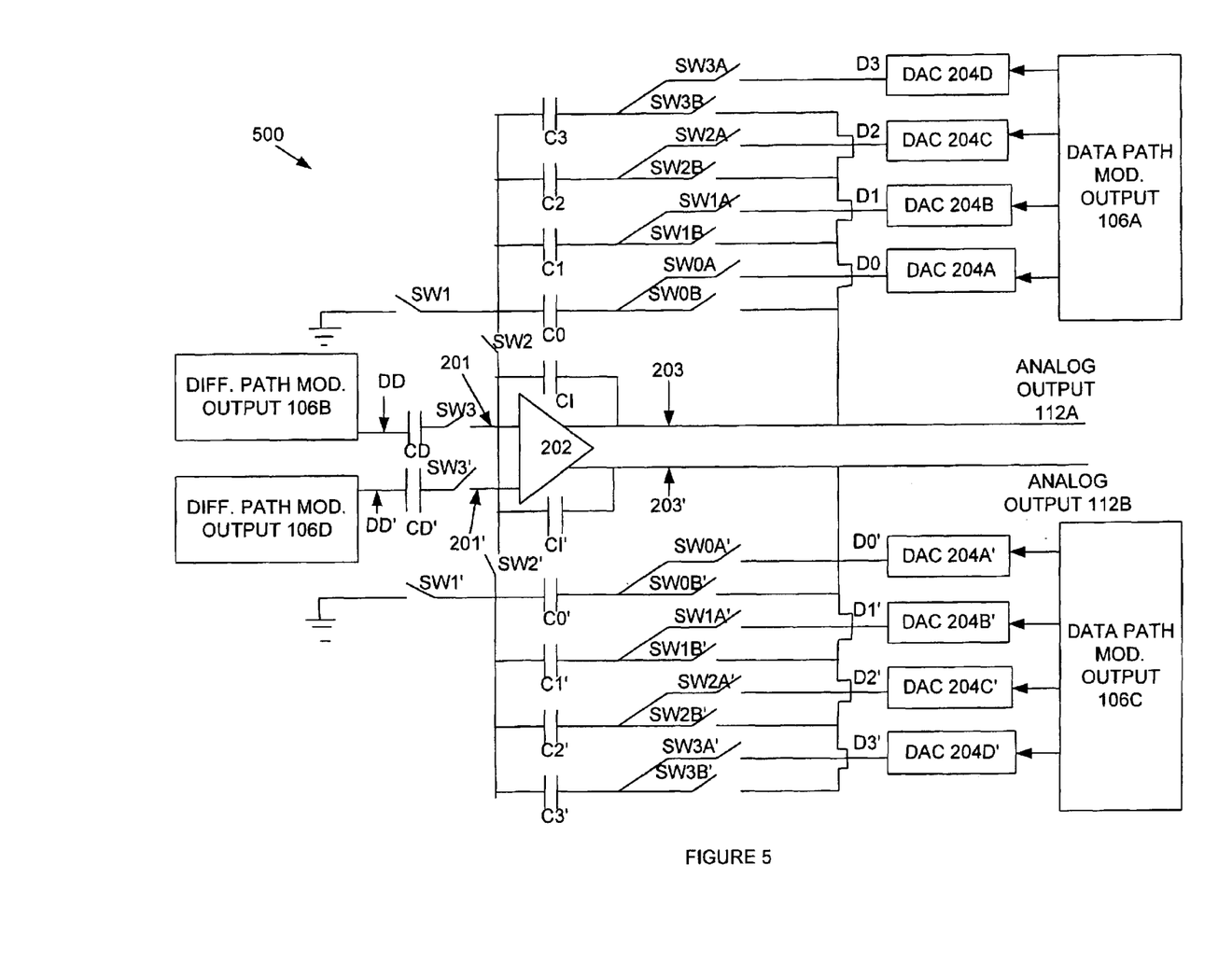
FIG. 5 is a circuit diagram of an exemplary full differential digital-to-analog converter ("DAC") output stage in accordance with the present invention that may be implemented in the DAC system of FIG. 4.

Referring now to FIG. 4, a block diagram of another exemplary digital-to-analog converter (DAC) system 400, which incorporates a digital-to-analog converter (DAC) output stage 500 of FIG. 5, is shown. DAC system 100 includes an interpolation filter 102, a multi-stage modulator 104A with a differential output, dynamic element matching (DEM) systems 108A and 108B, and a differential DAC output stage 110A (e.g., analog output stage) coupled together in series as shown in FIG. 1. Differential DAC output stage 110A may be DAC output stage 500 of FIG. 5.

Interpolation filter 102 and multi-stage modulator 104A generally operate in the same manner as described for interpolation filter 102 and multi-stage modulator 104 of DAC system 100 of FIG. 1. Multi-stage modulator 104A of DAC system 500 is similar to multi-stage modulator 104 of DAC system 100 except that the output of multi-stage modulator 104A for DAC system 500 is a differential output having two sets of outputs. Multi-stage modulator 104A produces a first set of differential output signals (e.g., digital signals 105A and 106B), having a high noise attenuation in a signal band of a noise transfer function of multi-stage modulator 104A. Multi-stage modulator 104A also produces a second set of differential output signals (e.g., digital signals 105B and 106D), which also have a high noise attenuation in a signal band of a noise transfer function of multi-stage modulator 104A. Digital signals 105A and 105B are data or direct path modulator output signals while digital signal 106B and 106D are differentiated path modulator output signals.

Digital signals 105A and 105B are fed into respective dynamic element matching (DEM) systems 108A and 108B. DEM systems 108A and 108B, in turn, produce data or direct path outputs 106A and 106C. Data or direct path outputs 106A and 106C from respective DEM systems 108A and 108B and differentiated path outputs 106B and 106D are fed into a differential DAC output stage 110A. DAC output stage 110A receives data path outputs 106A and 106C and differentiated path outputs 106B and 106D and converts these signals into differential analog outputs 112A and 112B. Analog outputs 112A and 112B are similarly defined by the earlier mathematical equation for output 112 for DAC output stages 200 and 300.

With reference now to FIG. 5, DAC output stage 500 is an exemplary embodiment of a full differential DAC output stage in accordance with the present invention. DAC output stage 500 has an operational amplifier 202 having an input 201 and an output 203 and another input 201' and another output 203'. A first integrating path is coupled in parallel to operational amplifier 202, and each of the ends of the first integrating path is respectively coupled to input 201 and output 203. A second integrating path is coupled in parallel to operational amplifier 202, and each of the ends of the second integrating path is respectively coupled to the other input 201' and the other output 203'. The first and second integrating paths are basically respective integrating capacitors CI and CI' as shown in FIG. 5. DAC output stage 500 further has a first data or direct path, which samples data (e.g., data bits D0, D1, D2, D3), and a second data or direct path, which samples other data (e.g., data bits D0', D1', D2', D3'), during a first time sampling phase. The first and second data or direct paths are coupled in parallel with respective first and second integrating paths during a second time sampling phase.

The first data or direct path in FIG. 5 includes direct capacitors C0, C1, C2, and C3 coupled in line with respective switches SW0A, SW1A, SW2A, and SW3A and further coupled in another line with respective switches SW0B, SW1B, SW2B, and SW3B. The second data or direct path in FIG. 5 has direct capacitors C0', C1', C2', and C3' coupled in another line with respective switches SW0A', SW1A', SW2A', and SW3A' and further coupled in another line with respective switches SW0B', SW1B', SW2B', and SW3B'. During a first time sampling phase $\phi_1$, switches SW0A, SW1A, SW2A, and SW3A and a first phase switch SW1 are activated to switchingly couple respective direct capacitors C0, C1, C2, and C3 between a ground reference and corresponding DAC elements 204A, 204B, 204C, and 204D in accordance with the control of DEM system 108A. Also, during the first time sampling phase $\phi_1$, switches SW0A', SW1A', SW2A', and SW3A' and first phase switch SW1' are activated to switchingly couple respective direct capacitors C0', C1', C2', and C3' between a ground reference and corresponding DAC elements 204A', 204B', 204C', and 204D' in accordance with the control of DEM system 108B. After a very slight delay, switches SW0B, SW1B, SW2B, SW3B, SW0B', SW1B', SW2B', SW3B' and second phase switches SW2 and SW3 and SW2' and SW3' are de-activated during the first time sampling phase $\phi_1$. During the first time sampling phase $\phi_1$, direct capacitors C0, C1, C2, and C3 correspondingly charge up for sampling the data (e.g., data bits D0, D1, D2, D3) based on data path modulator output 106A, and direct capacitors C0', C1', C2', and C3' correspondingly charge up for sampling the data (e.g., data bits D0', D1', D2', D3') based on data path modulator output 106C.

During a second time sampling phase $\phi_2$, switches SW0B, SW1B, SW2B, and SW3B and second phase switch SW2 are activated to switchingly couple respective direct capacitors C0, C1, C2, and C3 in parallel with integrating capacitor CI and operational amplifier 202 as shown in FIG. 5. Furthermore, during the second time sampling phase $\phi_2$, switches SW0B', SW1B', SW2B', and SW3B' and second phase switch SW2' are activated to switchingly couple respective direct capacitors C0', C1', C2', and C3' in parallel with integrating capacitor CI' and operational amplifier 202 as shown in FIG. 5. After a very slight delay, switches SW0A, SW1A, SW2A, SW3A, SW0A', SW1A', SW2A', and SW3A' and first phase switches SW1 and SW1' are de-activated during the second time sampling phase $\phi_2$.

During the second time sampling phase $\phi_2$, a first differentiated path is coupled to input 201 of operational amplifier 202. The first differentiated path has one or more differentiation capacitors CD and additional second phase switch SW3, which are coupled together in series as shown in FIG. 5. Second phase switch SW3 is activated to couple differentiation capacitor CD to the input of operational amplifier 202, which receives differentiated path modulator output 106B (e.g., data bit DD), during the second time sampling phase. Differentiation capacitor CD charges up according to differentiated path modulator output 106B. Also, during the second time sampling phase $\phi_2$, a second differentiated path is coupled to another input 201' of operational amplifier 202. The second differentiated path has one or more differentiation capacitors CD' and additional second phase switch SW3', which are coupled together in series as shown in FIG. 5. Second phase switch SW3' is activated to couple differentiation capacitor CD' to the input of operational amplifier 202, which receives differentiated path modulator output 106D (e.g., data bit DD), during the second time sampling phase. Differentiation capacitor CD' charges up according to differentiated path modulator output 106D.

Operational amplifier 202 then operates as a buffer to transfer and convert the charges among capacitors CD, CI, C0, C1, C2, and C3 into an analog output 112 and to transfer and convert the charges among capacitors CD', CI', C0', C1', C2', and C3' into an analog output 112B.

The present invention provides a new type of charge transfer buffer for the DAC output stage, which accommodates both the data or direct path and the differentiated path of a multi-stage modulator. The present invention allows a MASH modulator or other such multi-stage modulator with both data and differentiated paths to utilize such a charge transfer buffer and have the advantages and benefits of such a charge transfer buffer. The present invention provides a digital-to-analog converter (DAC) output stage, which has an operational amplifier, an integrating path, a direct or data path, and a differentiated path. The integrating path is coupled in parallel to the operational amplifier. Each of the ends of the integrating path is respectively coupled to an input and an output of the operational amplifier. The direct or data path samples data during a first time sampling phase and is coupled in parallel with the integrating path during a second time sampling phase. The differentiated path is coupled in series with a data input voltage to the input of the operational amplifier.

Although the invention has been described with reference to a specific embodiment(s), these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention

What is claimed is:

1. A digital-to-analog converter (DAC) output stage, comprising:
    an operational amplifier;
    an integrating path coupled in parallel to the operational amplifier wherein each of the ends of the integrating path is respectively coupled to an input and an output of the operational amplifier;
    a direct path that samples data during a first time sampling phase and is coupled in parallel with the integrating path during a second time sampling phase; and
    a differentiated path coupled in series with a data input voltage to the input of the operational amplifier.

2. The DAC output stage according to claim 1, wherein the integrating path further comprises an integrating capacitor.

3. The DAC output stage according to claim 1, wherein the differentiated path is coupled to the input of the operational amplifier during the second time sampling phase.

4. The DAC output stage according to claim 3, wherein:
    the differentiated path further comprises at least one differentiation capacitor; and
    the DAC output stage further comprises a second phase switch coupled between the input of the operational amplifier and one end of the direct path wherein the second phase switch is activated during the second sampling time phase and de-activated during the first sampling time phase.

5. The DAC output stage according to claim 4, further comprising:
    another second phase switch coupled in series to the at least one differentiation capacitor wherein the another second phase switch is activated during the second sampling time phase and de-activated during the first sampling time phase.

6. The DAC output stage according to claim 1, wherein the direct path further comprises:
    a direct capacitor;
    one switch coupled in one line with the direct capacitor wherein the one switch is activated during the first time sampling phase to switchingly couple the direct capacitor between a ground reference voltage and a digital-to-analog converter element for sampling the data; and
    another switch coupled in another line with the direct capacitor wherein the another switch is activated during the second time sampling phase to switchingly couple the direct capacitor in parallel to the operational amplifier.

7. The DAC output stage according to claim 1, wherein the direct path further comprises multiple direct paths coupled in parallel to each other and the operational amplifier and wherein each of the multiple direct paths further comprises:
- a direct capacitor;
- one switch coupled in one line with the direct capacitor wherein the one switch is activated during the first time sampling phase to switchingly couple the direct capacitor between a ground reference voltage and a digital-to-analog converter element for sampling the data; and
- another switch coupled in another line with the direct capacitor wherein the another switch is activated during the second time sampling phase to switchingly couple the direct capacitor in parallel to the operational amplifier.

8. The DAC output stage according to claim 1, wherein: the integrating path, the direct path, and the differentiated path are single bit paths.

9. The DAC output stage according to claim 1, wherein: the integrating path, the direct path, and the differentiated path are multi-bit paths.

10. A differential digital-to-analog converter (DAC) output stage, comprising:
- an operational amplifier having a first input, a second input, a first output, and a second output;
- a first integrating path coupled in parallel to the operational amplifier wherein each of the ends of the first integrating path is respectively coupled to the first input and the first output of the operational amplifier;
- a first direct path that samples data during a first time sampling phase and is coupled in parallel with the first integrating path during a second time sampling phase;
- a first differentiated path coupled in series with a first data input voltage to the first input of the operational amplifier;
- a second integrating path coupled in parallel to the operational amplifier wherein each of the ends of the second integrating path is respectively coupled to the second input and the second output of the operational amplifier;
- a second direct path that samples data during the first time sampling phase and is coupled in parallel with the second integrating path during the second time sampling phase; and
- a second differentiated path coupled in series with a second data input voltage to the second input of the operational amplifier.

11. The differential DAC output stage according to claim 10, wherein the first integrating path further comprises a first integrating capacitor and wherein the second integrating path further comprises a second integrating capacitor.

12. The differential DAC output stage according to claim 10, wherein the first differentiated path is coupled to the first input of the operational amplifier during the second time sampling phase and the second differentiated path is coupled to the second input of the operational amplifier during the second time sampling phase.

13. The differential DAC output stage according to claim 12, wherein:
- the first differentiated path further comprises at least one differentiation capacitor;
- the DAC output stage further comprises a second phase switch coupled between the first input of the operational amplifier and one end of the first direct path wherein the second phase switch is activated during the second sampling time phase and de-activated during the first sampling time phase;
- the second differentiated path further comprises at least another differentiation capacitor; and
- wherein the DAC output stage further comprises another second phase switch coupled between the second input of the operational amplifier and one end of the second direct path wherein the another second phase switch is activated during the second sampling time phase and de-activated during the first sampling time phase.

14. The differential DAC output stage according to claim 13, further comprising:
- a further second phase switch coupled in series to the at least one differentiation capacitor wherein the further second phase switch is activated during the second sampling time phase and de-activated during the first sampling time phase; and
- a still further second phase switch coupled in series to the at least another differentiation capacitor wherein the still further second phase switch is activated during the second sampling time phase and de-activated during the first sampling time phase.

15. The differential DAC output stage according to claim 10, wherein:
the first direct path further comprises:
- a first direct capacitor;
- a first switch coupled in a first line with the first direct capacitor wherein the first switch is activated during the first time sampling phase to switchingly couple the first direct capacitor between a ground reference voltage and a digital-to-analog converter element for sampling the data; and
- a second switch coupled in a second line with the first direct capacitor wherein the second switch is activated during the second time sampling phase to switchingly couple the first direct capacitor in parallel to the operational amplifier; and the second direct path further comprises:
- a second direct capacitor;
- a third switch coupled in a third line with the second direct capacitor wherein the third switch is activated during the first time sampling phase to switchingly couple the second direct capacitor between another ground reference voltage and another digital-to-analog converter element for sampling the data; and
- a fourth switch coupled in a fourth line with the second direct capacitor wherein the fourth switch is activated during the second time sampling phase to switchingly couple the second direct capacitor in parallel to the operational amplifier.

16. The differential DAC output stage according to claim 10, wherein the first direct path and the second direct path further comprise multiple direct paths coupled in parallel to each other and the operational amplifier and wherein each of the multiple direct paths further comprises:
- a direct capacitor;
- one switch coupled in one line with the direct capacitor wherein the one switch is activated during the first time sampling phase to switchingly couple the direct capacitor between a ground reference voltage and a digital-to-analog converter element for sampling the data; and
- another switch coupled in another line with the direct capacitor wherein the another switch is activated during the second time sampling phase to switchingly couple the direct capacitor in parallel to the operational amplifier.

17. The differential DAC output stage according to claim 1, wherein:
the first and second integrating paths, the first and second direct paths, and the first and second differentiated paths are single bit paths.

18. The differential DAC output stage according to claim 1, wherein:
the first and second integrating paths, the first and second direct paths, and the first and second differentiated paths are multi-bit paths.

19. A method of processing and outputting a signal by a digital-to-analog converter (DAC) output stage, comprising:
amplifying a signal by an operational amplifier;
integrating the signal through an integrating path coupled in parallel to the operational amplifier wherein each of the ends of the integrating path is respectively coupled to an input and an output of the operational amplifier;
sampling data by a direct path during a first time sampling phase wherein the direct path is coupled in parallel with the integrating path during a second time sampling phase; and
differentiating the sampled data by a differentiated path coupled in series with a data input voltage to the input of the operational amplifier.

20. A digital-to-analog converter (DAC) system, comprising:
an interpolation filter for interpolating a first digital signal at a first frequency to a second digital signal at a second frequency greater than the first frequency;
a multi-stage noise shaping (MASH) modulator having various delta-sigma noise shaping loops cascaded together that noise shapes the second digital signal to produce a third digital signal with a high noise attenuation in a signal band of a noise transfer function of the MASH modulator;
a digital-to-analog converter (DAC) output stage that includes:
one operational amplifier having one input and one output;
one integrating path coupled in parallel to the operational amplifier wherein each of the ends of the one integrating path is respectively coupled to the one input and the one output of the operational amplifier;
one direct path that samples data during a first time sampling phase and is coupled in parallel with the one integrating path during a second time sampling phase; and
one differentiated path coupled in series with a first data input voltage to the one input of the operational amplifier.

21. The DAC system according to claim 20, wherein the DAC output stage is a differential DAC output stage with another input and another output and the DAC output stage further comprises:
another integrating path coupled in parallel to the operational amplifier wherein each of the ends of the another integrating path is respectively coupled to the another input and the another output of the operational amplifier;
another direct path that samples data during the first time sampling phase and is coupled in parallel with the another integrating path during the second time sampling phase; and
another differentiated path coupled in series with a second data input voltage to the second input of the operational amplifier.

22. The DAC system according to claim 20, further comprising:
at least one dynamic element matching (DEM) system coupled between the MASH modulator and the DAC output stage for spreading mismatch noise across a signal band of an analog output.

* * * * *